United States Patent
Schoenfeld et al.

(12) 
(10) Patent No.: US 6,271,582 B1
(45) Date of Patent: *Aug. 7, 2001

(54) INTERDIGITATED LEADS-OVER-CHIP LEAD FRAME, DEVICE, AND METHOD FOR SUPPORTING AN INTEGRATED CIRCUIT DIE

(75) Inventors: Aaron Schoenfeld, Boise; Jerry M. Brooks, Caldwell, both of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/827,886

(22) Filed: Apr. 7, 1997

(51) Int. Cl.[7] .............................. H01L 29/41; H01L 23/48
(52) U.S. Cl. ........................ 257/676; 257/675; 257/783
(58) Field of Search .................................. 257/676, 675, 257/723, 783

(56) References Cited

U.S. PATENT DOCUMENTS

| | | |
|---|---|---|
| 4,862,245 | 8/1989 | Pashby et al. . |
| 4,937,656 * | 6/1990 | Kohara .................................. 257/676 |
| 4,949,161 * | 8/1990 | Allen .................................... 257/676 |
| 5,086,018 * | 2/1992 | Conru .................................... 257/676 |
| 5,147,815 | 9/1992 | Casto . |
| 5,218,168 | 6/1993 | Mitchell et al. . |
| 5,234,866 | 8/1993 | Okinaga et al. . |
| 5,250,840 | 10/1993 | Oh et al. . |
| 5,256,598 | 10/1993 | Farnworth et al. . |
| 5,303,120 * | 4/1994 | Michii .................................. 361/760 |
| 5,327,009 * | 7/1994 | Igeta .................................... 257/667 |
| 5,331,200 * | 7/1994 | Teo ...................................... 257/666 |
| 5,334,873 | 8/1994 | Cha . |
| 5,357,139 | 10/1994 | Yaguchi et al. . |
| 5,360,992 | 11/1994 | Lowrey et al. . |
| 5,365,113 | 11/1994 | Sakuta et al. . |
| 5,381,036 | 1/1995 | Bigler et al. . |
| 5,384,488 * | 1/1995 | Golshan ................................ 257/786 |
| 5,434,106 * | 7/1995 | Lim ...................................... 437/209 |
| 5,438,478 * | 8/1995 | Kondo .................................. 257/698 |
| 5,508,565 | 4/1996 | Hatakeyama et al. . |
| 5,521,426 | 5/1996 | Russell . |
| 5,523,617 | 6/1996 | Asanasavest . |
| 5,528,075 * | 6/1996 | Burns .................................... 257/676 |
| 5,530,292 | 6/1996 | Waki et al. . |
| 5,563,443 | 10/1996 | Beng et al. . |
| 5,585,667 * | 12/1996 | Asanasavest ........................... 257/676 |
| 5,585,668 | 12/1996 | Burns . |
| 5,612,259 * | 3/1997 | Okutomo .............................. 437/209 |
| 5,637,915 * | 6/1997 | Sato ...................................... 257/676 |
| 5,696,665 * | 12/1997 | Nagy .................................... 165/80.3 |
| 5,751,057 | 5/1998 | Palagonia . |
| 5,780,925 * | 7/1998 | Cipolla ................................. 257/676 |
| 5,804,870 * | 9/1998 | Burns .................................... 257/675 |
| 5,811,875 | 9/1998 | Jeong et al. . |
| 6,066,515 | 5/2000 | Schoenfeld . |

FOREIGN PATENT DOCUMENTS 5-109979 * 4/1993 (JP) ...................................... 257/692

* cited by examiner

*Primary Examiner*—Jerome Jackson, Jr.
(74) *Attorney, Agent, or Firm*—TraskBritt

(57) ABSTRACT

An inventive Leads-Over-Chip (LOC) lead frame includes an assembly of interdigitated leads constructed to overlie double-sided adhesive tape on the front-side surface of an integrated circuit (IC) die. An attachment surface of each lead is adhesively attachable to the tape, and at least some of the leads are constructed to extend across the front-side surface of the die from one edge substantially to another edge, such as an adjacent or opposing edge. As a result, a substantial area of the front-side surface of the die is adhesively attachable to the leads through the tape, so the die is supportable in an IC package in an improved manner, and the heat may be conducted away from the die through the lead frame in an improved manner.

11 Claims, 11 Drawing Sheets

INTERDIGITATED LEADS-OVER-CHIP LEAD FRAME, DEVICE, AND METHOD FOR SUPPORTING AN INTEGRATED CIRCUIT DIE

BACKGROUND

1. Field of the Invention

The present invention relates to interdigitated leads-over-chip lead frames and other devices and methods for supporting integrated circuit dice.

2. State of the Art

Integrated circuit (IC) dice or "chips" are small, generally rectangular IC devices cut from a semiconductor wafer, such as a silicon wafer, on which multiple IC's have been fabricated. Bare IC dice are typically packaged to protect them from corrosion by attaching them to a lead frame for support and heat conduction and then enclosing them in a die package.

Examples of conventional type lead frames having interdigitized lead frame strips and/or lead fingers thereon are illustrated in U.S. Pat. Nos. 4,949,161 and 5,147,815.

A conventional die package 10 including a type of lead frame referred to as a "Leads-Over-Chip" (LOC) lead frame 12 is shown in a cut-away view in FIG. 1. The LOC lead frame 12 includes an assembly of conductive leads 14, each having an underside attachment surface adhesively attached to a front-side surface of an IC die 16 using double-sided adhesive tape 18 so the assembly of conductive leads 14 physically supports the IC die 16 within the die package 10. Each conductive lead 14 is wire-bonded to one of a multitude of bond pads on the front-side surface of the IC die 16, and each conductive lead 14 extends from the die package 10 to terminate in a pin that may be connected to external circuitry (not shown) so circuitry within the IC die 16 may communicate with the external circuitry through the bond pads and the conductive leads 14. Of course, while the conductive leads 14 are shown in FIG. 1 as being wire-bonded to bond pads extending along a center axis of the front-side surface of the IC die 16, it will be understood that the leads of a LOC lead frame may also be wire-bonded to bond pads extending about the perimeter of the front-side surface of an IC die.

In another conventional 16 Meg. DRAM semiconductor memory device package for NEC Corporation, a die package 210 including a type of lead frame referred to as a "Leads-Over-Chip" (LOC) lead frame 212 is shown in a top view in FIG. 1A. The LOC lead frame 212, includes an assembly of conductive leads 214 each having an underside attachment surface adhesively attached to a front-side surface of an IC die 216 using double-sided adhesive tape (not shown) so the assembly of leads 214 physically supports the IC die 216 within the die package 210. Each conductive lead 214 is wire-bonded to one of a multitude of bond pads on the front-side surface of the IC die 216, and each lead 214 extends from the die package 210 to terminate in a pin that may be connected to external circuitry (not shown) so circuitry within the IC die 216 may communicate with the external circuitry through the bond pads and the conductive leads 214. As shown, the leads 214 in FIG. 1A are wire-bonded to bond pads extending along a single side axis of the front-side surface of the IC die 216.

In yet another conventional 4 Meg.×4 DRAM semiconductor memory device package for NEC Corporation, a die package 310 including a type of lead frame referred to as a "Leads-Over-Chip" (LOC) lead frame 312 is shown in a top view in FIG. 1B. The LOC lead frame 312 includes an assembly of conductive leads 314, each having an underside attachment surface adhesively attached to a front-side surface of an IC die 316 using double-sided adhesive tape (not shown) so the assembly of leads 314 physically supports the IC die 316 within the die package 310. Each conductive lead 314 is wire-bonded to one of a multitude of bond pads on the front-side surface of the IC die 316, and each lead 314 extends from the die package 310 to terminate in a pin that may be connected to external circuitry (not shown) so circuitry within the IC die 316 may communicate with the external circuitry through the bond pads and the conductive leads 314. As shown, the leads 314 in FIG. 1B are wire-bonded to bond pads extending along a single side axis of the front-side surface of the IC die 316.

LOC lead frames are well-known in the art, and are described in various embodiments in U.S. Pat. Nos. 4,862,245, 5,218,168, 5,250,840, 5,256,598, 5,381,036, 5,521,426, and 5,563,443.

Conventional LOC lead frames can sometimes be problematic because the arrangement and design of their leads do not allow the leads to cover an optimum percentage of the surface area of an IC die when attached to the die. As a result, the leads are unable to support the die as well as desired, and the leads do not extract as much heat as desired from the die.

In yet another type of lead frame configuration, a lead-under-chip type lead frame, illustrated in U.S. Pat. No. 5,360,992, the lead fingers extend under and beyond the semiconductor device, acting as a die paddle for the device, with ″″″wire bonds being formed between the bond pads located on the active surface of the semiconductor device and portions of the lead fingers extending therebeyond. This type of lead frame arrangement requires the use of long lead fingers to extend the length of the semiconductor device and therebeyond for wire bonding purposes, thereby affecting the response time of the semiconductor device assembly.

In still yet another type of lead frame and integrated circuit package, as illustrated in U.S. Pat. No. 5,585,668, two integrated circuit semiconductor devices are connected to a common, substantially planar lead frame, wherein the bond pads on each active surface of a semiconductor device face the common lead frame and are wire bonded to the lead fingers thereof.

Also, it can be difficult to produce die packages having "mirror image" pin-out arrangements using conventional LOC lead frames. A pair of such mirror image die packages has one set of die functions (e.g., $V_{CC}$, DQ1, DQ2, WE*, RAS*, A10, A0, A1, A2, and A3) associated with the left-side pins of a first one of the pair and the right-side pins of a second one of the pair, and has another set of functions (e.g., $V_{SS}$, DQ4, DQ3, CAS*, OE*, A9, A8, A7, A6, A5, and A4) associated with the right-side pins of the first one of the pair and the left-side pins of the second one of the pair. Such mirror image die packages can be useful, for example, when a pair of die packages are positioned opposite one another on opposing sides of a Single In-line Memory Module (SIMM) board and share the same conductors for identical functions. The difficulty in producing a pair of mirror image die packages using conventional LOC lead frames arises because producing the pair traditionally requires: a pair of mirror image dice and identical LOC lead frames, as described in U.S. Pat. Nos. 5,508,565 and 5,530,292; identical dice and a pair of mirror image LOC lead frames, as described in U.S. Pat. No. 5,508,565; or wire-bonding a central row of bond pads on one of the pair of dice to one of an identical pair of LOC lead frames and then reverse-wire-bonding a central row of bond pads on the other of the pair of dice to the other of the pair of LOC lead frames.

Because the traditional methods of producing mirror image die packages using mirror image dice and mirror image LOC lead frames require the production of an additional part, they are inefficient and expensive methods. In addition, using only dice with a central row of bond pads to make mirror image die packages is undesirably restrictive, since many dice have a different arrangement of bond pads.

Therefore, there is a need in the art for an LOC lead frame and other devices and methods for supporting IC dice in an improved manner. Such a LOC lead frame should be capable of producing mirror image die packages, if desired, using identical dice having a wide variety of different bond pad arrangements. The lead frame should also conduct heat away from a die in an improved manner.

SUMMARY

An inventive integrated circuit (IC) package includes double-sided adhesive tape overlying and adhesively attached to a front-side surface of an IC die. A Leads-Over-Chip (LOC) lead frame in the package includes a plurality of leads overlying the tape and the front-side surface. An attachment surface of each lead is adhesively attached to the tape, and at least some of the leads extend across the front-side surface of the die from one edge substantially to another edge. As a result, a substantial area of the front-side surface is adhesively attached to the leads through the tape, so the die is supported in the IC package in an improved manner, and heat is conducted away from the die in an improved manner.

In a further embodiment of the present invention, an electronic system includes an input device, an output device, a processor device, and a memory device, and one of the input, output, processor, and memory devices includes the IC package described above.

In another embodiment, an assembly for supporting an IC die includes support members, such as LOC lead frame leads, overlying a front-side surface of the die. An attachment surface of each support member is adhesively attached to the front-side surface, and at least some of the support members extend across the front-side surface from one edge substantially to another edge. As a result, a substantial area of the front-side surface is adhesively attached to the support members.

In a further embodiment, an IC package having a reversible pin-out arrangement includes double-sided adhesive tape overlying and adhesively attached to a front-side surface of an IC die. An LOC lead frame is supported by a package housing and includes a plurality of interdigitated leads overlying the tape and the front-side surface of the die with an attachment surface of each lead adhesively attached to the tape. Each lead in first and second groups of the leads is constructed to extend substantially from respective first and second opposing edges of the front-side surface of the die, across the front-side surface, over the respective second and first opposing edges, away from the die, and out respective first and second opposing sides of the housing to terminate in a pin. Each of a multitude of bond pads on the front-side surface of the die is alternately coupleable to adjacent first and second group leads. As a result, each bond pad is alternately accessible through pins on the first and second opposing sides of the housing, and the IC package thereby has a reversible pin-out arrangement.

In still another embodiment, an electronic device, such as a Single In-line Memory Module (SIMM) board, includes a base, such as a printed circuit board, a first IC package as described above with a first pin-out arrangement, and a second IC package as described above with a second pin-out arrangement that mirrors the first pin-out arrangement.

In a still further embodiment, an IC quad-package having a reversible pin-out arrangement includes double-sided adhesive tape overlying and adhesively attached to a front-side surface of an IC die. A LOC lead frame is supported by a package housing and includes a plurality of interdigitated leads overlying the tape and the front-side surface of the die with an attachment surface of each lead adhesively attached to the tape. Each lead in first, second, third, and fourth groups of the leads is constructed to extend substantially from respective first and second adjacent edges and third and fourth adjacent edges of the front-side surface of the die, across the front-side surface, over the respective second, first, fourth, and third edges, away from the die, and out respective first and second adjacent sides and third and fourth adjacent sides of the housing to terminate in a pin. Each of a first group of bond pads on the front-side surface of the die is alternately coupleable to adjacent first and second group leads, and each of a second group of bond pads on the front-side surface of the die is alternately coupleable to adjacent third and fourth group leads. As a result, each bond pad in the first group is alternately accessible through pins on the first and second adjacent sides of the housing, each bond pad in the second group is alternately accessible through pins on the third and fourth adjacent sides of the housing, and the IC quad-package thereby has a reversible pin-out arrangement.

In still another embodiment, an electronic device, such as a Single In-line Memory Module (SIMM) board, includes a base, such as a printed circuit board, a first IC quad-package as described above with a first pin-out arrangement, and a second IC quad-package as described above with a second pin-out arrangement that mirrors the first pin-out arrangement.

In an additional embodiment, a method for supporting an IC die in an IC package includes: positioning the die in proximity to a housing of the package; supporting a multitude of support members on the housing; and maintaining the position of the die in proximity to the housing by adhesively attaching an attachment surface of each support member to a front-side surface of the die and by extending at least some of the support members across the front-side surface in adhesive attachment with the surface from one edge substantially to another edge so a substantial area of the surface is adhesively attached to the support members.

DETAILED DESCRIPTION OF THE PREFERRED EMBODIMENTS

Figure 1:
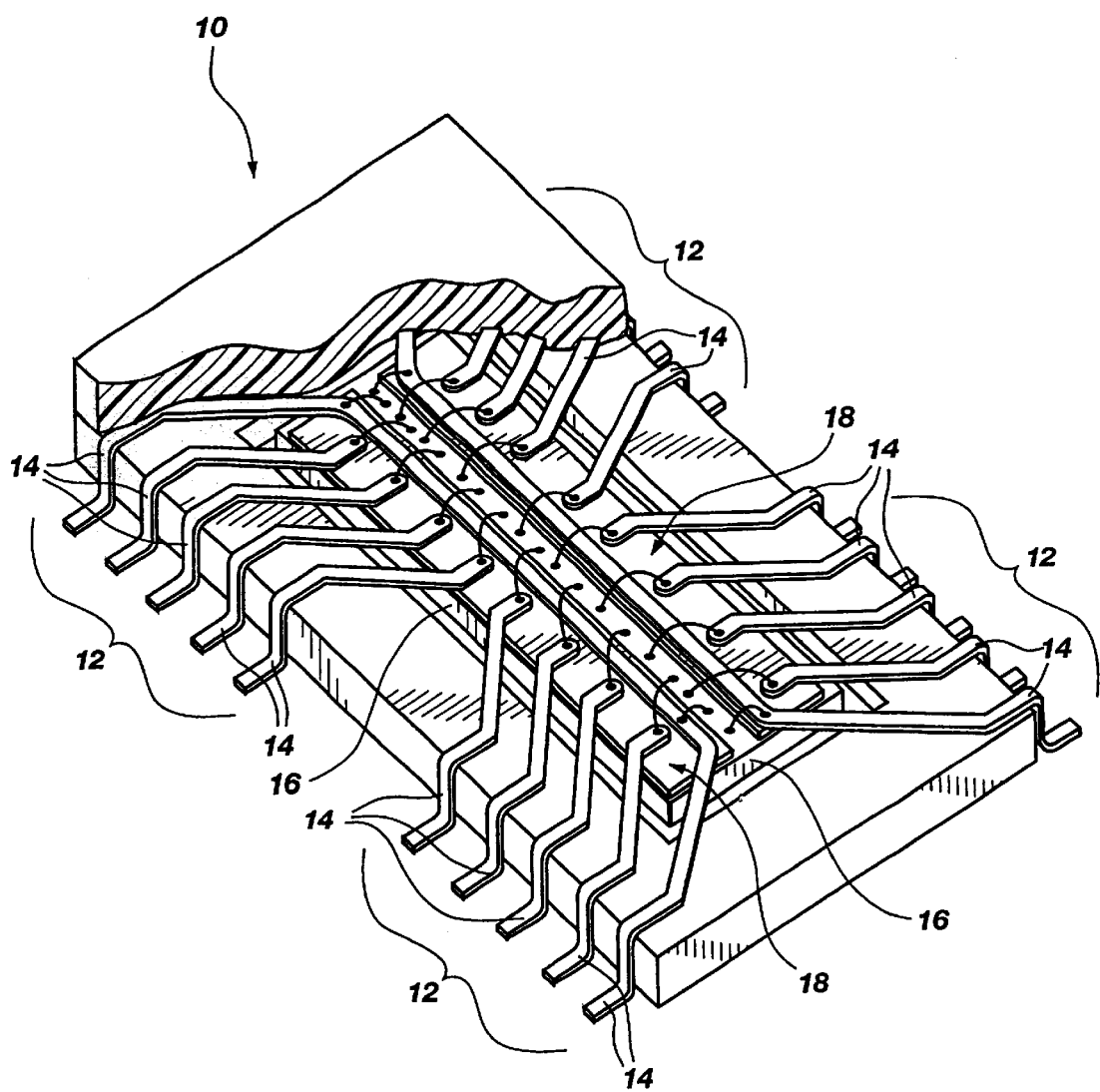
FIG. 1 is an isometric, cut-away view of a prior art integrated circuit (IC) die package having a Leads-Over-Chip (LOC) lead frame.
Figure 1A:
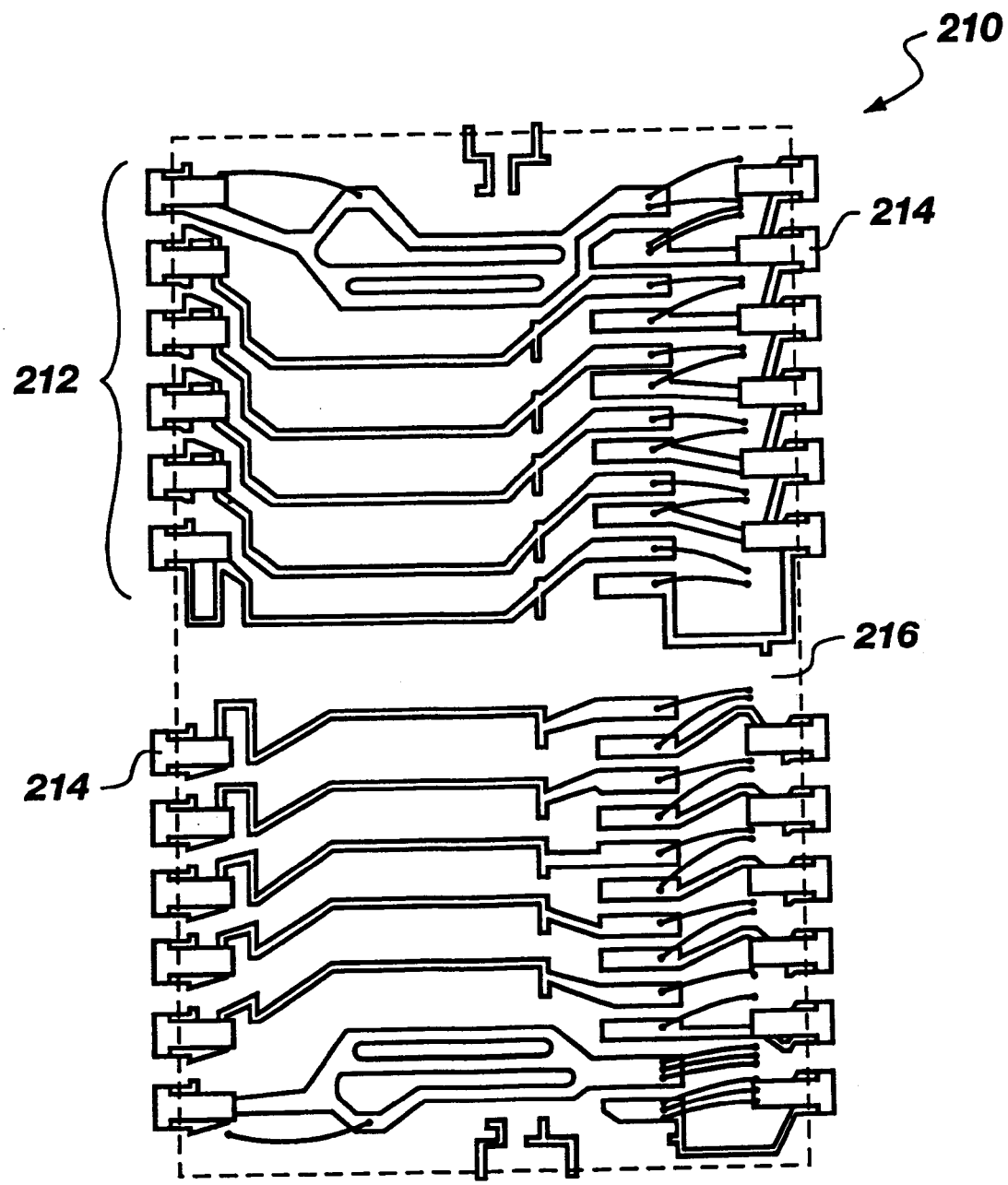
FIG. 1A is a top view of a prior art integrated circuit (IC) die package having a Leads-Over-Chip (LOC) lead frame.
Figure 1B:
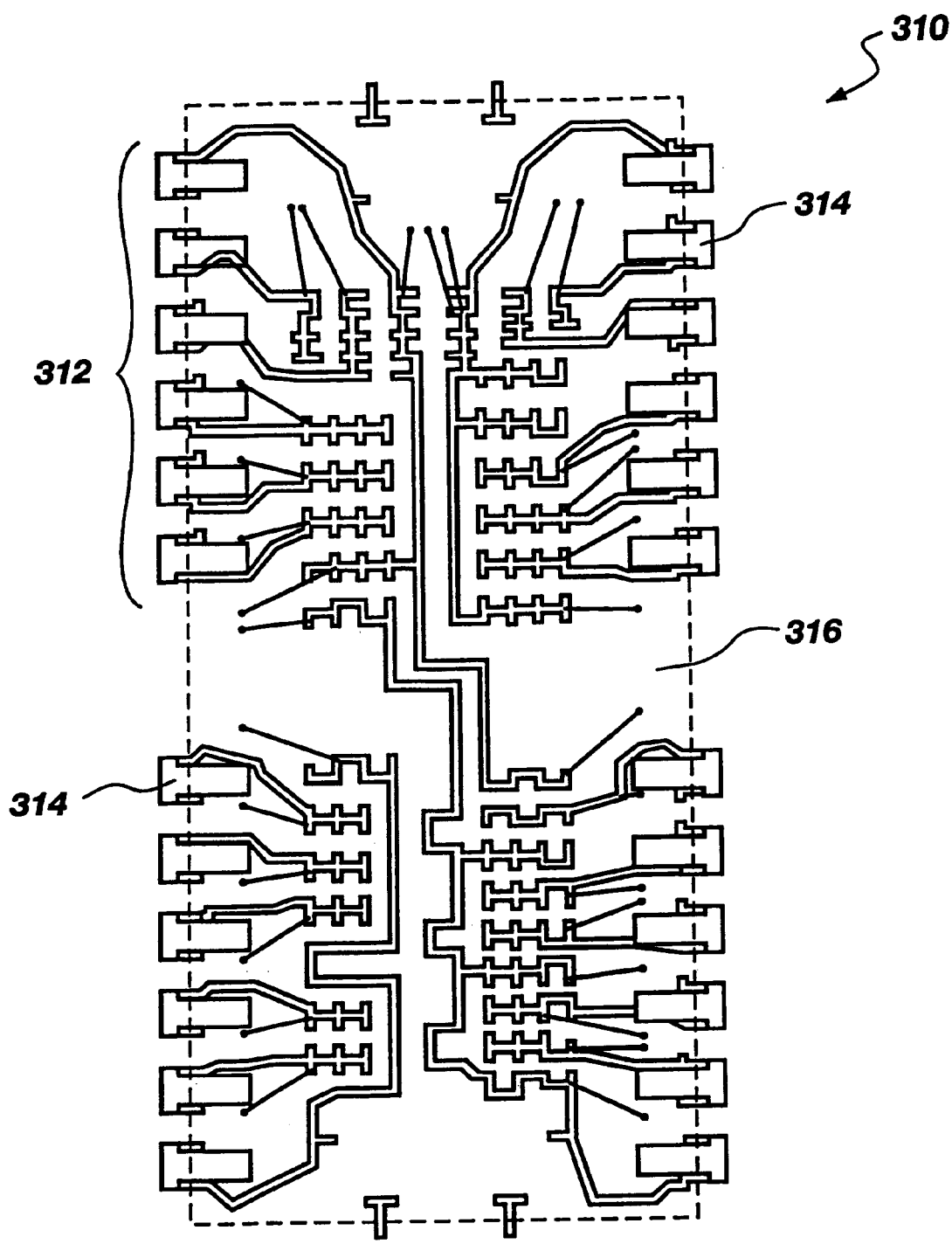
FIG. 1B is a top view of a prior art integrated circuit (IC) die package having a Leads-Over-Chip (LOC) lead frame.
Figure 2:
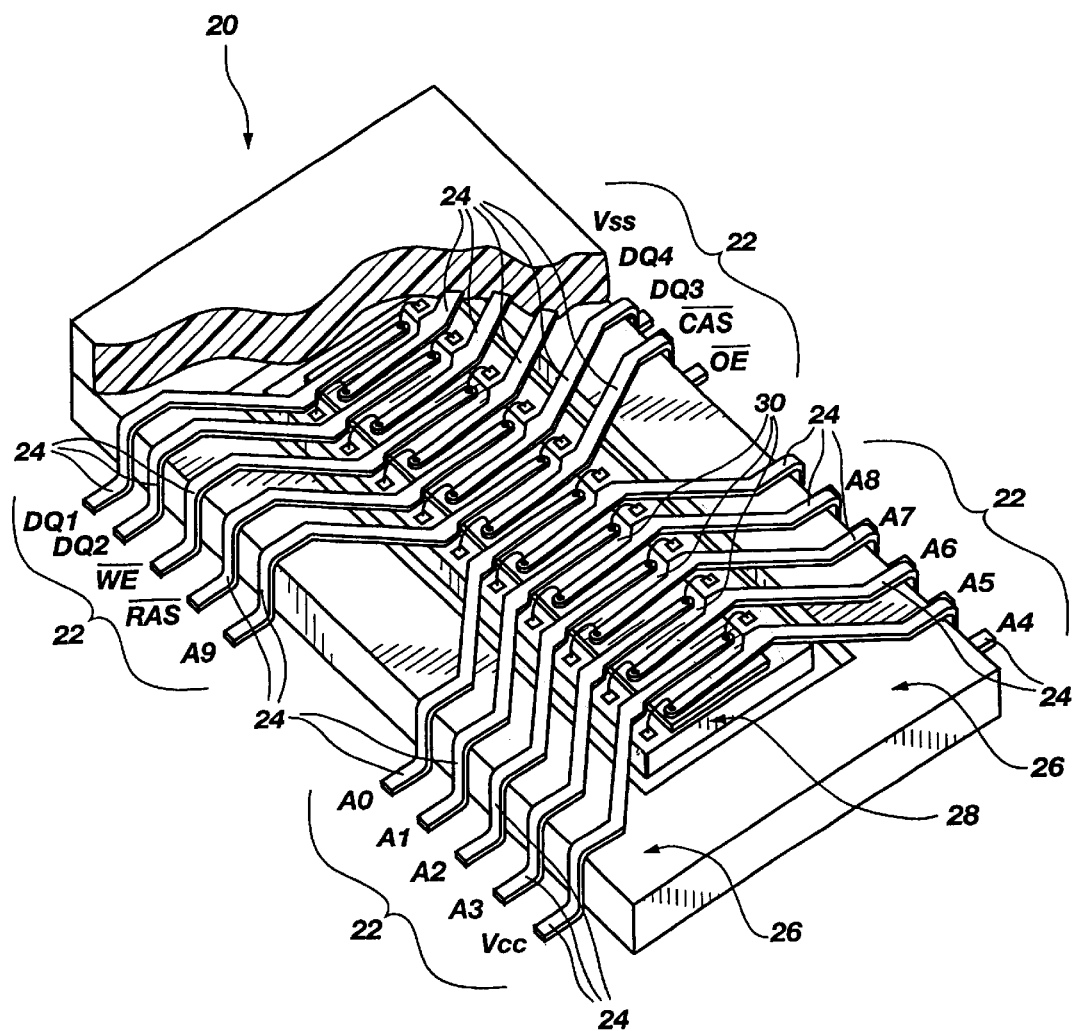
FIG. 2 is an isometric, cut-away view of an IC die package having an interdigitated LOC lead frame in accordance with the present invention.

As shown in a cut-away view in FIG. 2, an inventive die package 20 includes a Leads-Over-Chip (LOC) lead frame 22 comprising an assembly of interdigitated leads 24 supported by a housing 26. A portion of each of the leads 24 extends across a front-side surface of an integrated circuit (IC) die 28 from one edge substantially to another, opposing edge in close proximity to adjacent leads 24 and adhesively attached to the front-side surface using double-sided adhesive tape 30 so the leads 24 together support the IC die 28 within the die package 20. Because the leads 24 extend substantially from edge to edge across the front-side surface of the IC die 28 in close proximity to one another, a substantial area of the front-side surface (e.g., 30% to 80% or more) is adhesively attached to the leads 24, so the IC die 28 is supported in an improved manner, and heat is conducted away from the IC die 28 through the LOC lead frame 22 in an improved manner.

It will be understood by those having skill in the field of this invention that while the die package 20 is shown in FIG. 2 in the form of a Thin Small Outline Package (TSOP), the present invention is equally applicable to any die package including, for example, a Thin Quad Flat Pack (TQFP), a Small Outline J-lead (SOJ) package, a Plastic Leaded Chip Carrier (PLCC), and a Dual In-line Package (DIP). Also, although the leads 24 of the LOC lead frame 22 are shown in FIG. 2 having a particular shape and a particular arrangement with respect to one another, it will be understood that the present invention includes within its scope lead frame leads and other support members having any shape and any arrangement that extend substantially from edge to opposing edge across the front-side surface of an IC die in adhesive attachment therewith.

Further, it will be understood that the present invention includes within its scope any support members extending across an IC die as described, not just support members, such as the leads 24, that serve as conductors for an IC die. Still further, it will be understood that the IC die 28 may comprise any IC die, and that the double-sided adhesive tape 30 may comprise any adhesive tape for attaching the leads 24 to the front-side surface of the IC die 28. In addition, it will be understood that while all the leads 24 are shown in FIG. 2 extending substantially from edge to edge across the IC die 28, the present invention includes within its scope lead frames in which only some of the leads extend substantially from edge to edge across an IC die.

Each of the leads 24 is wire-bonded to one of a multitude of bond pads on the front-side surface of the IC die 28, and each of the leads 24 extends from the die package 20 to terminate in a pin that may be connected to external circuitry (not shown) so circuitry within the IC die 28 may communicate with the external circuitry through the bond pads and the leads 24. Thus, for example, one of the leads 24 is wire-bonded at one end to an A0 address bit bond pad on the front-side surface of the IC die 28 and extends from the die package 20 to terminate in an A0 address bit pin. Of course, while the leads 24 are shown in FIG. 2 as being wire-bonded to bond pads extending about the perimeter of the front-side surface of the IC die 28, it will be understood that the present invention includes within its scope leads 24 wire-bonded to bond pads located anywhere on an IC die. It will also be understood that the functions (i.e., A0, A1, $V_{CC}$, DQ4, etc.) shown in FIG. 2 associated with the die package 20 are illustrative only, and that the scope of the present invention is not limited to any particular function set.

Figure 3:
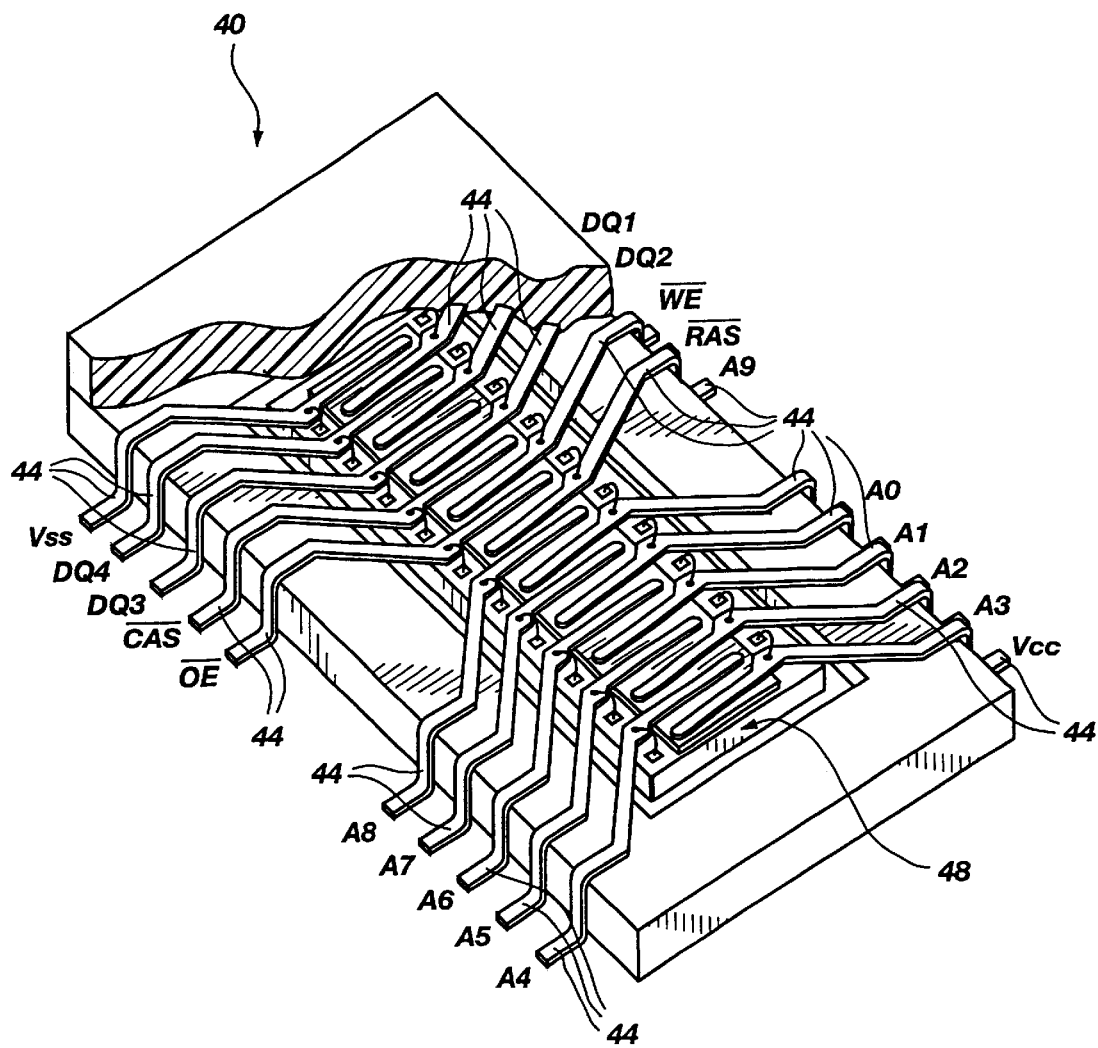
FIG. 3 is an isometric, cut-away view of an IC die package in accordance with the present invention having a pin-out arrangement that is the mirror-image of a pin-out arrangement of the package of FIG. 2.

As shown in FIG. 3, a die package 40 is identical to the die package 20 of FIG. 2, except that the pin-out arrangement of the die package 40 mirrors the pin-out arrangement of the die package 20 as a result of each of a plurality of interdigitated leads 44 being wire-bonded near its mid-point to an alternative bond pad on the front-side surface of an IC die 48. As a consequence of this advantageous feature of the present invention, identical dice and LOC lead frames can be used to produce mirror image die packages. As discussed above, such die packages are advantageous because they can be placed on opposing sides of a base, such as a printed circuit Single In-line Memory Module (SIMM) board, with their common pins in alignment, thereby simplifying the routing of signals to the packages. Such a SIMM board is described below with respect to FIG. 5.

Figure 4A:
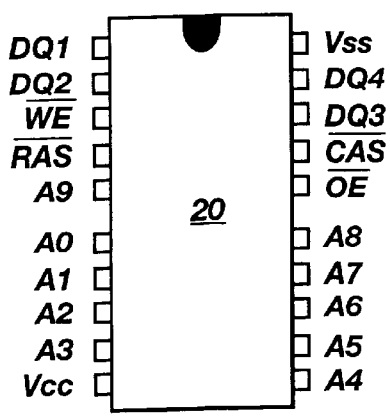
FIGS. 4A and 4B are top plan views of the IC die packages of FIGS. 2 and 3.
Figure 4B:
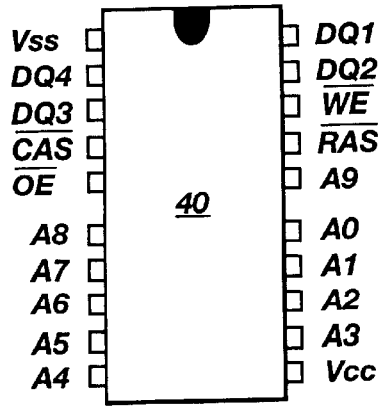

The mirror image die packages 20 and 40 of FIGS. 2 and 3 are shown in top plan views in FIGS. 4A and 4B, respectively, for clarity.

Figure 5:
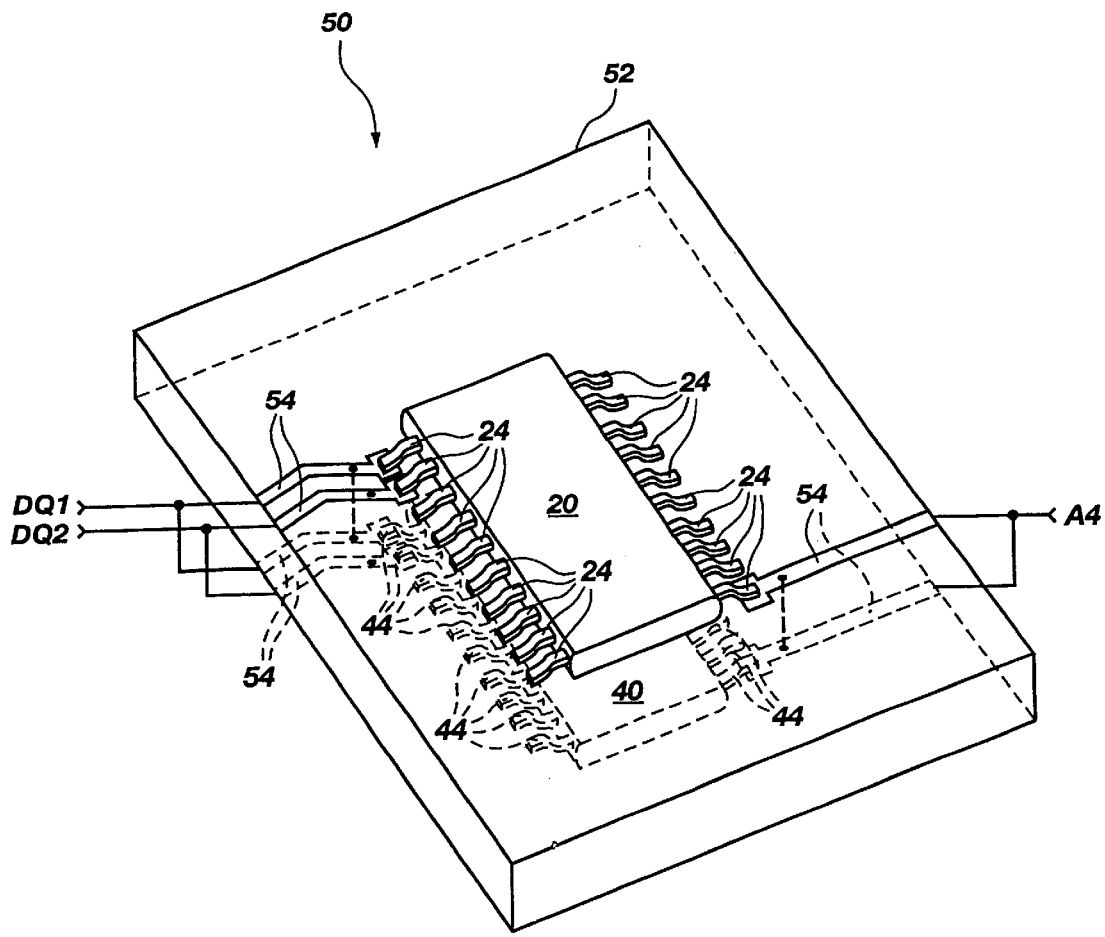
FIG. 5 is an isometric view of a portion of a Single In-line Memory Module (SIMM) board including the IC die packages of FIGS. 2 and 3.

As shown in FIG. 5, an electronic device 50 includes a portion of a base, such as a SIMM board 52, which includes the mirror image die packages 20 and 40 of FIGS. 2 and 3 attached to opposite sides of the SIMM board 52 with leads 24 and 44 associated with identical functions (e.g., DQ1, DQ2, and A4) opposing one another. Of course, it will be understood that while the functions associated with only some of the leads 24 and 44 are shown in FIG. 5 for clarity, each of the leads 24 and 44 typically has a function associated with it (or is a no-connection lead), as described above with respect to FIGS. 2, 3, 4A, and 4B. Because the pin-out arrangements of the die packages 20 and 40 are mirror images of one another, the routing of signals common to both packages (e.g., DQ1, DQ2, and A4) through circuit traces 54 is simpler than the routing typically necessary with die packages attached to opposite sides of a SIMM board that are not mirror image die packages.

Figure 6:
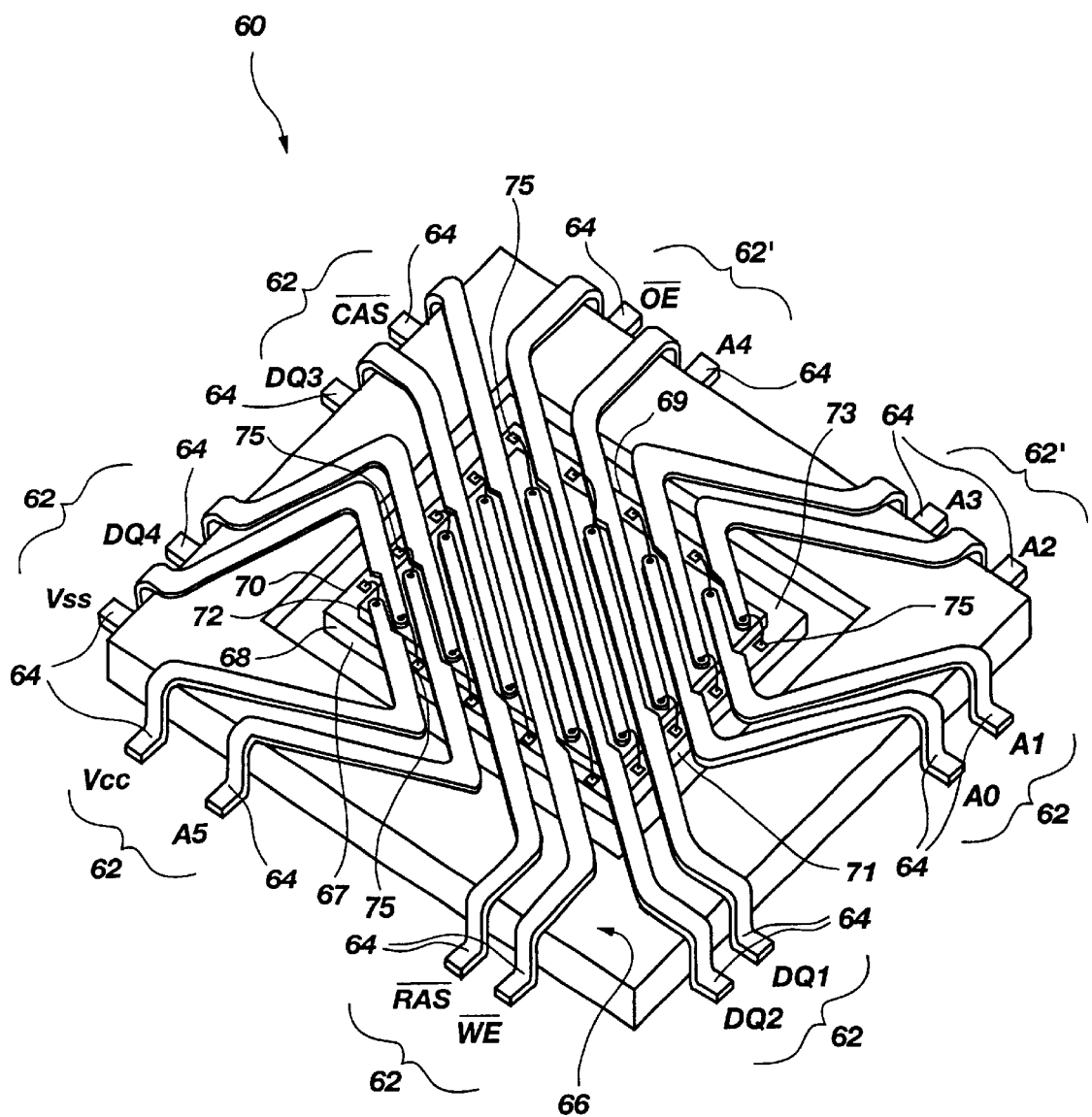
FIG. 6 is an isometric view of a portion of an IC die quad-package having an interdigitated LOC lead frame in accordance with another embodiment of the present invention.

As shown in FIG. 6 in a view of a portion of a quad-package which is not encapsulated in plastic material to form a completed packaged IC device assembly, an inventive die quad-package 60 includes a LOC lead frame 62 comprising an assembly of interdigitated leads 64 supported by a housing 66. A portion of each of the leads 64 extends across a front-side surface of an IC die 68 from one edge substantially to another, adjacent edge in close proximity to adjacent leads 64 and is adhesively attached to the front-side surface using double-sided adhesive tape 70 so the leads 64 together support the IC die 68 within the die quad-package 60. Because the leads 64 extend substantially from edge to edge across the front-side surface of the IC die 68 in close proximity to one another, a substantial area of the front-side surface (e.g., 30% to 80% or more) is adhesively attached to the leads 64, so the IC die 68 is supported in an improved manner, and heat is conducted away from the IC die 68 through the LOC lead frame 62 in an improved manner.

It will be understood by those having skill in the field of this invention that while the die quad-package 60 is shown in FIG. 6 in the form of a Thin Quad Flat Pack (TQFP), the present invention is equally applicable to any die quad-package. Also, although the leads 64 of the LOC lead frame 62 are shown in FIG. 6 having a particular shape and a particular arrangement with respect to one another, it will be understood that the present invention includes within its scope lead frame leads and other support members having any shape and any arrangement that extend substantially from edge to adjacent edge across the front-side surface of an IC die in adhesive attachment therewith.

Further, it will be understood that the present invention includes within its scope any support members extending across an IC die as described, not just support members, such as the leads 64, that serve as conductors for an IC die. Still further, it will be understood that the IC die 68 may comprise any IC die, and that the double-sided adhesive tape 70 may comprise any adhesive tape for attaching the leads 64 to the front-side surface of the IC die 68. In addition, it will be understood that while all the leads 64 are shown in FIG. 6 extending substantially from edge to edge across the IC die 68, the present invention includes within its scope lead frames in which only some of the leads extend substantially from edge to edge across an IC die.

Each of the leads 64 is wire-bonded to one of a multitude of bond pads on the front-side surface of the IC die 68, and each of the leads 64 extends from the die quad-package 60 to terminate in a pin that may be connected to external circuitry (not shown) so circuitry within the IC die 68 may communicate with the external circuitry through the bond pads and the leads 64. Thus, for example, one of the leads 64 is wire-bonded at one end to an A0 address bit bond pad on the front-side surface of the IC die 68 and extends from the die quad-package 60 to terminate in an A0 address bit pin. Of course, while the leads 64 are shown in FIG. 6 as being wire-bonded to bond pads extending about the perimeter of the front-side surface of the IC die 68, it will be understood that the present invention includes within its scope leads 64 wire-bonded to bond pads located anywhere on an IC die. It will also be understood that the functions (i.e., A0, A1, $V_{CC}$, DQ4, etc.) shown in FIG. 6 associated with the die quad-package 60 are illustrative only, and that the scope of the present invention is not limited to any particular function set.

Figure 7:
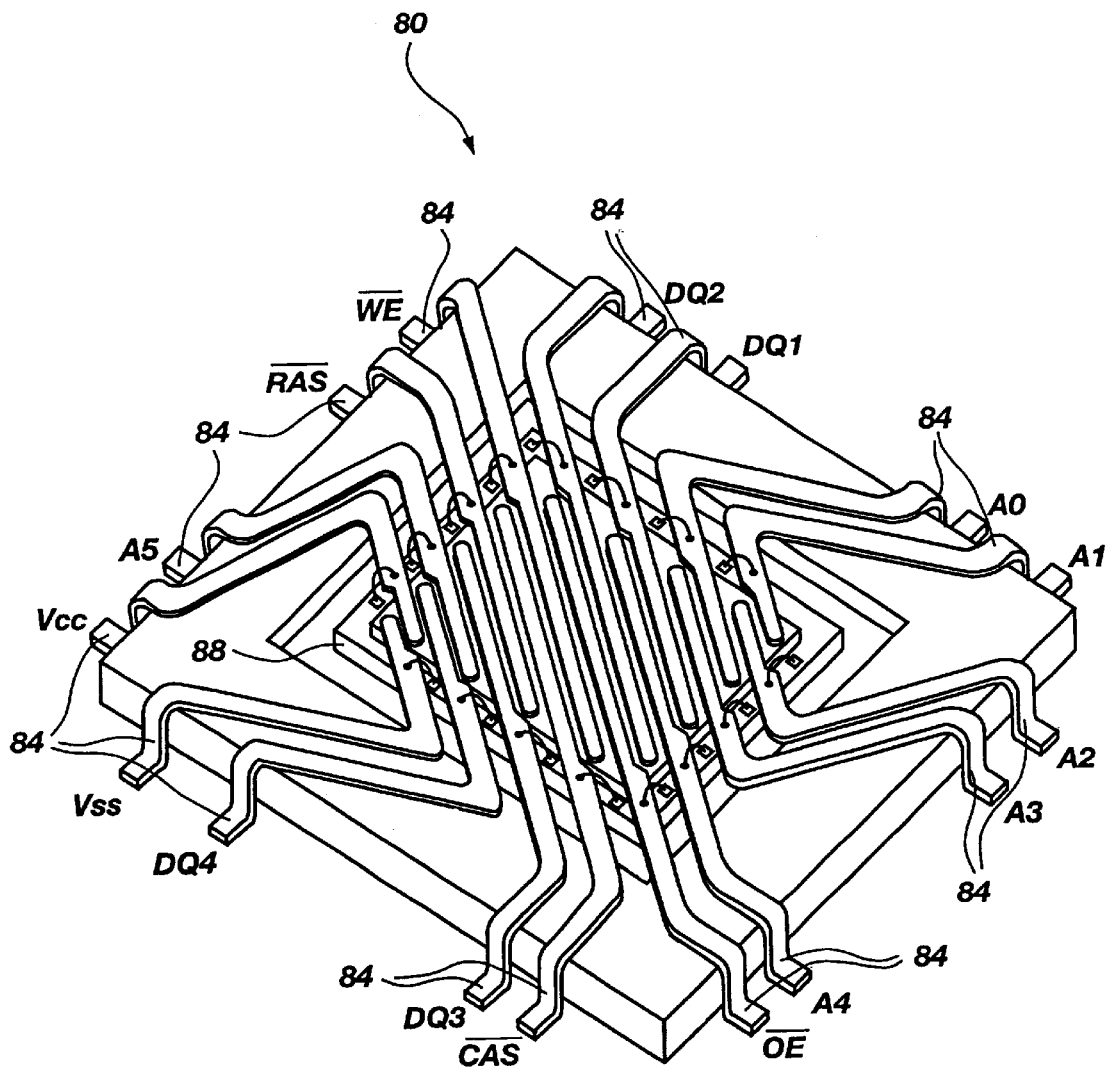
FIG. 7 is an isometric cut-away view of a portion of an IC die quad-package in accordance with the present invention having a pin-out arrangement that is the mirror-image of a pin-out arrangement of the quad-package of FIG. 6.

As shown in FIG. 7 in a view of a portion of a quad-package IC device which has not been encapsulated in plastic material to form a completed IC device assembly, a die quad-package 80 is identical to the die quad-package 60 of FIG. 6, except that the pin-out arrangement of the die quad-package 80 mirrors the pin-out arrangement of the die quad-package 60 as a result of each of a plurality of interdigitated leads 84 being wire-bonded near its mid-point to an alternative bond pad on the front-side surface of an IC die 88. As a consequence of this advantageous feature of the present invention, identical dice and LOC lead frames can be used to produce mirror image die quad-packages. As discussed above, such die quad-packages are advantageous because they can be placed on opposing sides of a base, such as a printed circuit Single In-line Memory Module (SIMM) board, with their common pins in alignment, thereby simplifying the routing of signals to the quad-packages. Such a SIMM board is described below with respect to FIG. 9.

Figure 8A:
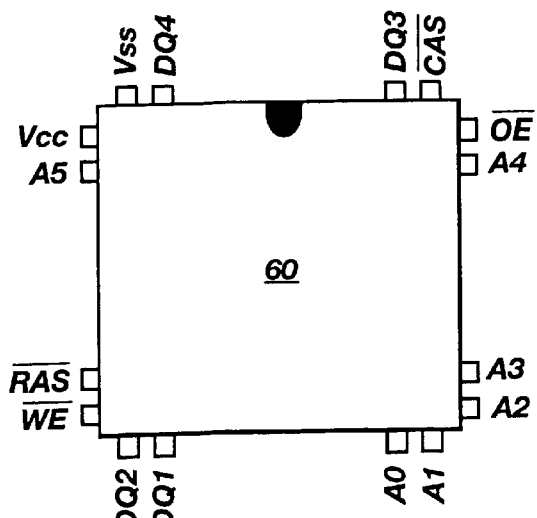
FIGS. 8A, 8B, and 8C are top plan views of the IC die quad-packages of FIGS. 6 and 7.
Figure 8B:
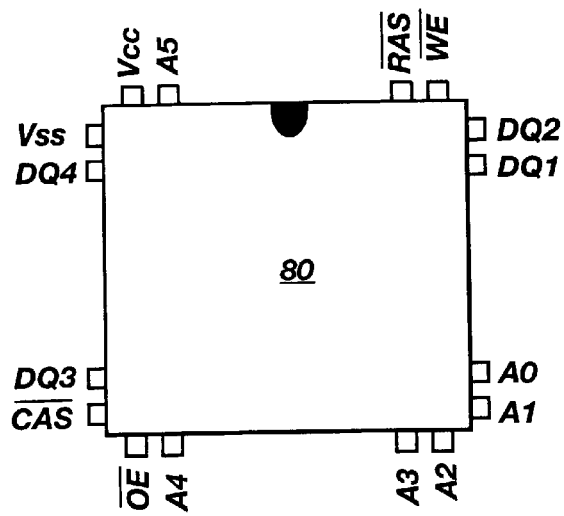
Figure 8C:
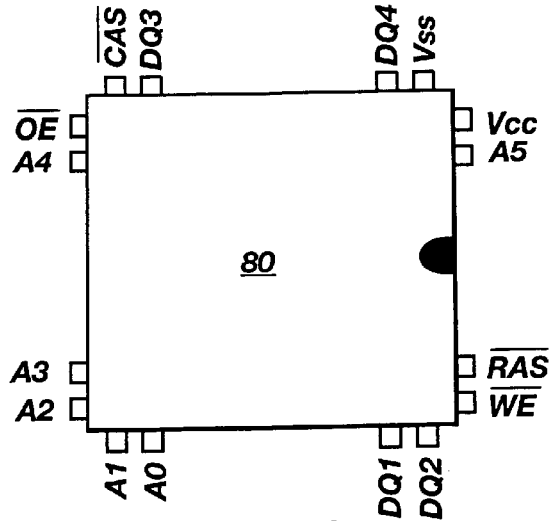

The mirror image die quad-packages 60 and 80 of FIGS. 6 and 7 are shown in top plan views in FIGS. 8A and 8B, respectively, for clarity. The die quad-package 80 of FIG. 7 is also shown turned clockwise by 90° in a top plan view in FIG. 8C in order to illustrate more clearly the mirror image relationship between the die quad-package 60 of FIG. 6 and the die quad-package 80 of FIG. 7.

Although illustrated as mirror image die quad-packages 60 and 80 in FIGS. 6 and 7, it should be understood that alternative arrangements other than mirror images may be made using the same lead frame design and bond pad configuration for the quad-packages 60 and 80 by attaching the lead fingers of the lead frame by means of insulating adhesive tape to the surface of the IC die for example 68 or 88, selecting the desired bond pads of the IC die for the desired functions of the IC die, burning out the various fuses associated with non-selected bond pads of the IC die to cause such bond pads to be inoperative, and then wire bonding the operative selected bond pads of the IC die to the desired lead fingers of the lead frame. In this manner, various operative configurations of an IC die and lead frame, other than mirror images, may be obtained using the same IC die and lead frame design.

Figure 9:
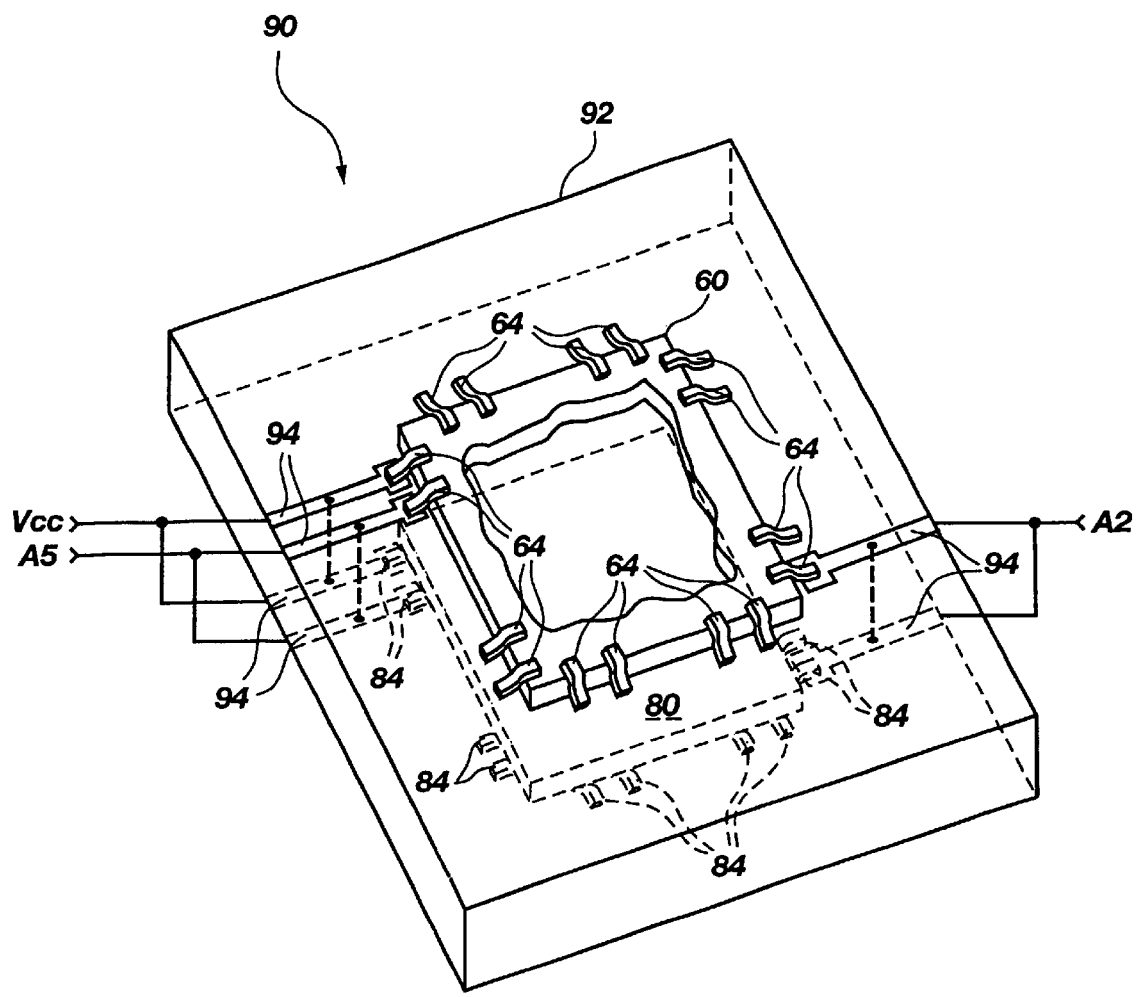
FIG. 9 is an isometric view of a portion of a SIMM board including the IC die quad-packages of FIGS. 6 and 7.

As shown in FIG. 9, an electronic device 90 includes a portion of a base, such as a SIMM board 92, which includes the mirror image die quad-packages 60 and 80 of FIGS. 6 and 7 attached to opposite sides of the SIMM board 92 with leads 64 and 84 associated with identical functions (e.g., $V_{CC}$, A2, and A5) opposing one another. Of course, it will be understood that while the functions associated with only some of the leads 64 and 84 are shown in FIG. 9 for clarity, each of the leads 64 and 84 typically has a function associated with it (or is a no-connection lead), as described above with respect to FIGS. 6, 7, 8A, 8B, and 8C. Because the pin-out arrangements of the die quad-packages 60 and 80 are mirror images of one another, the routing of signals common to both packages (e.g., $V_{CC}$, A2, and A5) through circuit traces 94 is simpler than the routing typically necessary with die quad-packages attached to opposite sides of a SIMM board that are not mirror image die quad-packages.

Figure 10:
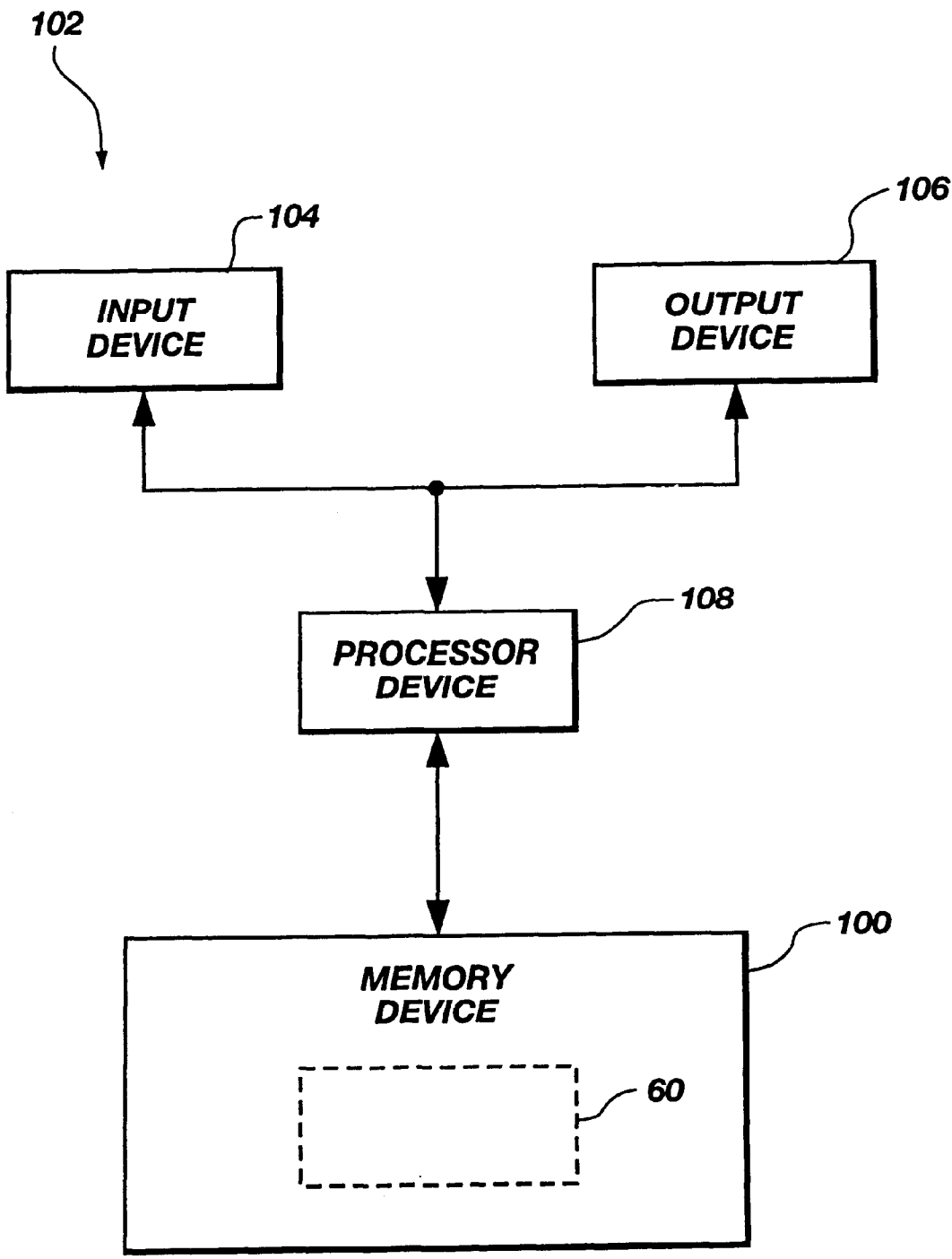
FIG. 10 is a block diagram of an electronic system including the IC die quad-package of FIG. 6.

As shown in FIG. 10, the die quad-package 60 of FIG. 6 is incorporated into a memory device 100 in an electronic system 102, such as a computer system, that also includes an input device 104, an output device 106, and a processor device 108. Of course, it will be understood that while the die quad-package 60 is shown in FIG. 10 incorporated into the memory device 100, it may also be incorporated into any one of the input, output, and processor devices 104, 106, and 108. Also, it will be understood that the electronic system 102 may include any one of the packages 20, 40, and 80 of FIGS. 2, 3, 4A, 4B, 5, 7, 8A, 8B, 8C, and 9 instead of, or in addition to, the package 60 of FIG. 6.

Thus, the present invention provides a LOC lead frame and other devices and methods for supporting IC dice in an improved manner. The inventive LOC lead frame is capable of producing mirror image die packages, if desired, using identical dice having a wide variety of different bond pad arrangements. The inventive lead frame is also capable of conducting heat away from a die in an improved manner.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. An integrated circuit package comprising:

an integrated circuit die having a front-side surface with a plurality of bond pads thereon, said integrated circuit die having a first edge and an opposing second edge, having at least one bond pad said plurality of bond pads located on the front-side surface adjacent the first edge, and having at least one bond pad of said plurality of bond pads located on the front-side surface adjacent the opposing second edge;

a Leads-Over-Chip (LOC) lead frame including a plurality of interdigitated leads for overlying the front-side surface of the integrated circuit die with a first portion of the plurality of interdigitated leads extending across from substantially the first edge of the integrated circuit die to substantially the at least one bond pad located adjacent the opposing second edge of the integrated circuit die terminating at a location on the front-side surface of said integrated circuit die adjacent and before the at least one bond pad adjacent the opposing second edge and a second portion of the plurality of interdigitated leads extending across from substantially the opposing second edge of the integrated circuit die to substantially the at least one bond pad located adjacent the first edge of the integrated circuit die terminating at a location on the front-side surface of said integrated circuit die adjacent and before the at least one bond pad adjacent the first edge, said first portion of the plurality of interdigitated leads being interdigitated with said second portion of the plurality of interdigitatrd leads, each bond pad of the plurality on the front-side surface being alternatively coupleable via an electrical connection extending only over the front-side surface to adjacent leads of the first and second portions of the plurality of interdigitated leads; and a piece of tape overlying a portion of said front-side surface of said integrated circuit die, said piece of tape located between said integrate circuit die and said LOC lead frame for securing said integrated circuit die to said LOC lead frame.

2. The integrated circuit package of claim 1 wherein the first and second portion of the plurality of interdigitated leads extend to an edge of the piece of tape proximate to the respective opposing second and first edges of the integrated circuit die.

3. The integrated circuit package of claim 1 wherein at least some of the plurality of interdigitated leads are for extending across the front-side surface of the integrated circuit die from the first edge thereof substantially to the opposing second edge thereof so that at least 80% of an area thereof is adhesively attached to the plurality of interdigitated leads through the piece of tape.

4. An integrated circuit package having a reversible pin-out arrangement, the integrated circuit package comprising:

an integrated circuit die having a front-side surface with a plurality of bond pads thereon, having a first edge, and an opposing second edge, at least one bond pad of the plurality of bond pads located adjacent the first edge of the integrated circuit die and at least one bond pad of the plurality of bond pads located adjacent the opposing second edge of the integrated circuit die;

a housing having a first side and an opposing second side;

a Leads-Over-Chip (LOC) lead frame disposed within the housing and including a plurality of interdigitated leads, each lead of the plurality of interdigitated leads in first and second groups of leads extending substantially from respective said first edge and opposing second edge of the front-side surface, at least one lead of said first group of leads terminating prior to said at least one bond pad of the plurality of bonds pads located adjacent the opposing second edge of the integrated circuit die and at least one lead of said second group of leads terminating before said at least one bond pad of the plurality of bond pads located adjacent the first edge of the integrated circuit die, across the front-side surface, over the respective opposing second edge and first edge of the front-side surface, away from the integrated circuit die, and out the respective first and opposing second sides of the housing to terminate in a pin, each bond pad of the plurality of bond pads on the front-side surface being alternatively coupleable by an electrical connection extending over only the front-side surface to an adjacent lead of the first and second group of leads so each bond pad is alternatively accessible through pins of the respective first and opposing second sides of the housing; and a piece of tape overlying a portion of said front-side surface of said integrated circuit die, said piece of tape between said integrated circuit die and said LOC lead frame.

5. The integrated circuit package of claim 4 wherein said each of the plurality of interdigitated leads in the first and second groups of the leads is constructed to extend substantially from the respective first and opposing second edges of the piece of tape proximate to the respective first and opposing second edges of the front-side surface.

6. An integrated circuit package comprising:

an integrated circuit die having a front-side surface having a plurality of bond pads thereon, having a first edge, an opposing second edge, at least one bond of the plurality of bond pads located on the front-side surface adjacent the first edge, and at least one bond pad of the plurality of bond pads located on the front-side surface adjacent the opposing second edge;

tape for overlying the front-side surface of the integrated circuit die; and a Leads-Over-Chip (LOC) lead frame including a plurality of interdigitated leads for overlying the tape and the front-side surface of the integrated circuit die, a first portion of the plurality of interdigitated leads extending across the front-side surface from the first edge thereof substantially to the opposing second edge thereof terminating on the front-side surface of the integrated circuit die before the at least one bond pad of the plurality of bond pads located adjacent the first edge of the integrated circuit die and a second portion of the plurality of interdigitated leads extending across the front-side surface from the opposing second edge thereof substantially to the first edge thereof terminating on the front-side surface of the integrated circuit die before the at least one bond pad of the plurality located adjacent the opposing second edge, said first portion of the plurality of interdigitated leads being interdigitated with said second portion of leads and each bond pad on the front-side surface being alternatively coupleable via an electrical connection extending only over the front-side surface to adjacent leads of the first and second portions of the plurality of interdigitated leads.

7. The integrated circuit package of claim 6 wherein the first portion of the plurality of interdigitated leads for extending across the front-side surface of the integrated circuit die from the first edge thereof substantially to the opposing second edge thereof are for extending to an edge of the tape proximate to the opposing second edge of the front-side surface.

8. The integrated circuit package of claim 6 wherein the front-side surface of the integrated circuit die has a plurality of bond pads thereon, wherein at least some of the plurality of interdigitated leads are for extending across the front-side surface of the integrated circuit die from the first edge thereof substantially to the opposing second edge thereof to couple to one of the plurality of bond pads.

9. The integrated circuit package of claim 6 wherein the front-side surface of the integrated circuit die has a plurality of bond pads thereon, wherein at least some of the plurality of interdigitated leads are for extending across the front-side surface of the integrated circuit die from the first edge thereof substantially to another, adjacent edge thereof to couple to one of the plurality of bond pads.

10. An integrated circuit package having a reversible pin-out arrangement, the integrated circuit package comprising:
    a integrated circuit die having a front-side surface with a plurality of bond pads thereon and having a first edge and an opposing second edge, at least one bond pad of the plurality of bond pads on the front-side surface located adjacent the first edge and at least one bond pad of the plurality of bond pads on the front-side surface located adjacent the opposing second edge;
    tape overlying a portion of the front-side surface of the integrated circuit die;
    a housing having a first side and an opposing second side;
    a Leads-Over-Chip (LOC) lead frame supportable by the housing and including a plurality of interdigitated leads overlying the tape and portions of the front-side surface of the integrated circuit die, each lead in first and second groups of leads of the plurality of interdigitated leads extending substantially from respective first edge and opposing second edge of the front-side surface and having an end thereof terminating before said at least one bond pad of said plurality of bond pads located adjacent one of said first edge and said opposing second edge of said integrated circuit die, extending over the respective opposing second edge and first edge of the front-side surface of said integrated circuit die, extending away from the integrated circuit die, and extending out the respective first side and opposing second side of the housing to terminate in a pin, each bond pad of the plurality of bond pads on the front-side surface being alternately compellable to adjacent first and second group leads of the plurality of interdigitated leads so said each bond pad of the plurality of bond pads located on the front-side surface of the integrated circuit die is alternatively electrically connected via an electrical connection extending across only the front-side surface to the plurality of interdigitated leads extending across the front-side surface of the integrated circuit die and accessible through pins on the first and opposing second sides of the housing.

11. The integrated circuit package of claim 10 wherein said each lead in the first and second groups of the leads of the plurality of interdigitated leads is constructed to extend substantially from respective first and second edges of the tape proximate to the respective first and opposing second edges of the front-side surface.

\* \* \* \* \*

UNITED STATES PATENT AND TRADEMARK OFFICE
CERTIFICATE OF CORRECTION

PATENT NO. : 6,271,582 B1
DATED : August 7, 2001
INVENTOR(S) : Aaron Schoenfeld and Jerry M. Brooks It is certified that error appears in the above-identified patent and that said Letters Patent is hereby corrected as shown below:

Column 1,
Line 15, change "IC's" to -- ICs --
Line 52, after "of" insert -- conductive --
Line 55, after "each" insert -- conductive --
Line 60, after "the" insert -- conductive --

Column 2,
Line 5, after "of" insert -- conductive --
Line 8, after "each" insert -- conductive --
Line 13, after "the" insert -- conductive --
Line 31, delete "´´´´´" before "wire"
Line 56, change "are" to -- is --
Line 58, change "share" to -- shares --

Column 3,
Line 11, change "an" to -- a --
Line 50, change "An" to -- A --

Column 5,
Line 26, after "and" insert -- is --

Column 9,
Line 6, after "one bond pad" insert -- of --
Line 31, change "interdigitatrd" to -- interdigitated --

UNITED STATES PATENT AND TRADEMARK OFFICE
CERTIFICATE OF CORRECTION

PATENT NO. : 6,271,582 B1
DATED : August 7, 2001
INVENTOR(S) : Aaron Schoenfeld and Jerry M. Brooks It is certified that error appears in the above-identified patent and that said Letters Patent is hereby corrected as shown below:

Column 10,
Line 27, after "each" insert -- lead --

Column 12,
Line 4, after "respective" insert -- said --

Signed and Sealed this

Eighteenth Day of March, 2003

JAMES E. ROGAN
*Director of the United States Patent and Trademark Office*